US011456253B2

(12) United States Patent
Sugioka et al.

(10) Patent No.: US 11,456,253 B2
(45) Date of Patent: Sep. 27, 2022

(54) SEMICONDUCTOR DEVICE AND METHOD OF FORMING THE SAME

(71) Applicant: MICRON TECHNOLOGY, INC., Boise, ID (US)

(72) Inventors: Shigeru Sugioka, Higashihiroshima (JP); Hidenori Yamaguchi, Higashihiroshima (JP); Noriaki Fujiki, Kawanishi (JP); Keizo Kawakita, Higashihiroshima (JP); Raj K. Bansal, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/872,147

(22) Filed: May 11, 2020

(65) Prior Publication Data

US 2021/0351133 A1  Nov. 11, 2021

(51) Int. Cl.
*H01L 23/532* (2006.01)
*H01L 29/06* (2006.01)
*H01L 23/498* (2006.01)
*H01L 23/538* (2006.01)

(52) U.S. Cl.
CPC .... *H01L 23/5329* (2013.01); *H01L 23/49883* (2013.01); *H01L 23/5383* (2013.01); *H01L 29/0649* (2013.01)

(58) Field of Classification Search
CPC ........... H01L 23/5329; H01L 23/49883; H01L 23/5383; H01L 23/562; H01L 29/0649; H01L 21/78; H01L 27/10844; H01L 27/10894
USPC ........................................................ 257/506
See application file for complete search history.

(56) References Cited

U.S. PATENT DOCUMENTS

| 5,493,926 A   * | 2/1996 | Vines ...................... G01N 3/46 |
| | | 257/E21.53 |
| 9,406,625 B2 * | 8/2016 | Wang .................... H01L 23/585 |
| 2001/0014515 A1* | 8/2001 | Ha ...................... H01L 29/0657 |
| | | 438/457 |
| 2002/0000642 A1* | 1/2002 | Lin ........................ H01L 22/32 |
| | | 257/620 |
| 2012/0126228 A1* | 5/2012 | Fischer ................. H01L 23/562 |
| | | 257/48 |

* cited by examiner

Primary Examiner — Dao H Nguyen
(74) Attorney, Agent, or Firm — Dorsey & Whitney LLP

(57) ABSTRACT

A semiconductor device includes a main circuit region; and a scribe region surrounding the main circuit region; wherein the main circuit region and the scribe region comprises first and second insulating films and a low-k film formed therebetween; and wherein the low-k film of the scribe region includes a plurality of cavities lining along a border between the main circuit region and the scribe region.

7 Claims, 24 Drawing Sheets

SEMICONDUCTOR DEVICE AND METHOD OF FORMING THE SAME

BACKGROUND

For example, in a semiconductor device such as dynamic random-access memory (hereinafter referred to as DRAM), low-k film having a low dielectric constant between metal interconnects is provided in some cases to reduce the capacitance between interconnects and achieve high-speed operation of the electric circuit.

However, whereas in the past $SiO_2$ has been used as an interlayer film for Cu interconnects and $Si_3N_4$ has been deposited above the Cu interconnects to prevent the diffusion of Cu. Recently, SLOG and SiCN for example are being used as films having an even lower dielectric constant. In the following description, SiOC and SiCN are collectively referred to as low-k films. These low-k films have lower adhesion than silicon oxide films and silicon nitride films, furthermore, the material is brittle. For these reasons, when a semiconductor wafer on which semiconductor elements such as DRAM are formed is diced to separate the semiconductor wafer into individual semiconductor chips, cracks produced by dicing sometimes propagate in the low-k film and the film interface ($SiO_2/SiOC$, $SiOC/SiCN$, $SiCN/SiO_2$) and reach the main circuit region of the semiconductor device, thereby reducing the yield of the semiconductor device.

BRIEF DESCRIPTION OF THE DRAWINGS

FIG. 4 is a longitudinal section of the portion along the line X-X in FIG.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

First Embodiment

Figure 1:
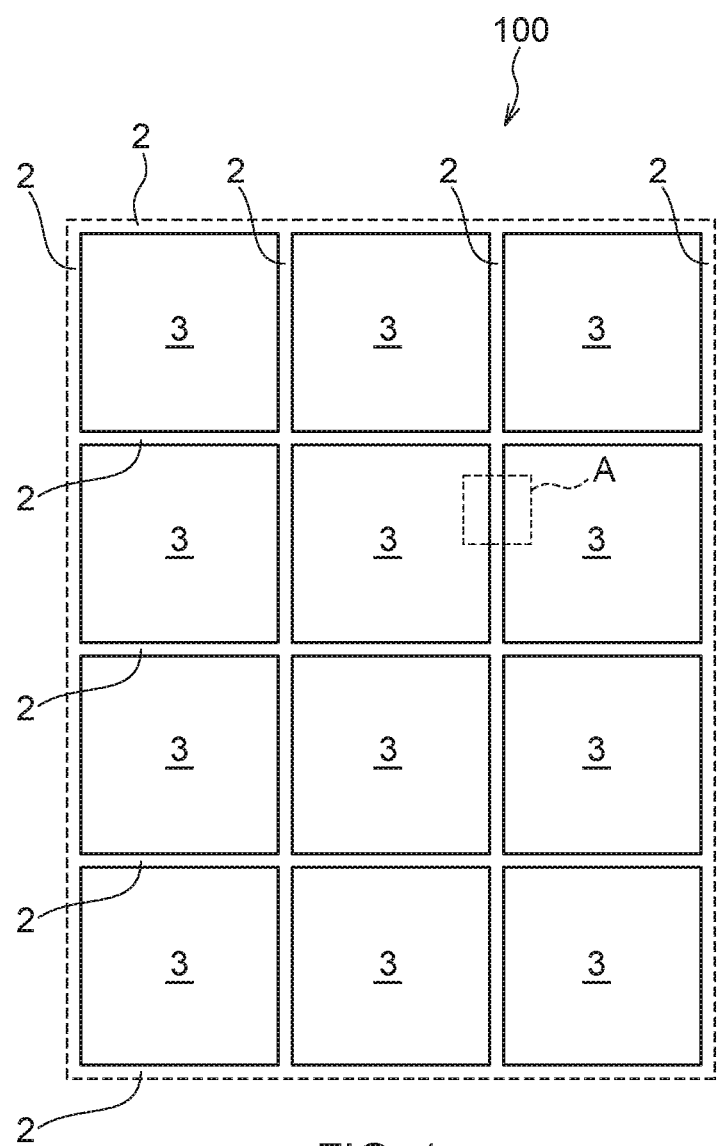
FIG. 1 is a plan view illustrating one example of a schematic configuration of the layout of a semiconductor device according to a first embodiment.

The first embodiment will be described with reference to FIGS. 1 to 11. In the following description, DRAM is given as an example of the semiconductor device. FIG. 1 is a plan view illustrating a schematic configuration of the layout of a plurality of main circuit regions 3 and a scribe region 2 formed on a semiconductor wafer 100.

The semiconductor wafer 100 illustrated in FIG. 1 is schematically illustrated in the state before the semiconductor wafer is cut by a dicing step, or in other words, the state before the semiconductor wafer is separated into individual semiconductor chips. In the semiconductor wafer 100, the plurality of main circuit regions 3 have rectangular shapes, and are arranged in a matrix. In the main circuit regions 3 transistors forming DRAM are disposed, or alternatively, circuit elements such as conductive interconnects are formed. The scribe region 2 is disposed around each of the main circuit regions 3. In the main circuit region, components such as a plurality of memory cells, a data-related circuit that reads and writes memory cell data, and a control circuit that controls the data-related circuit are provided.

Figure 1A:
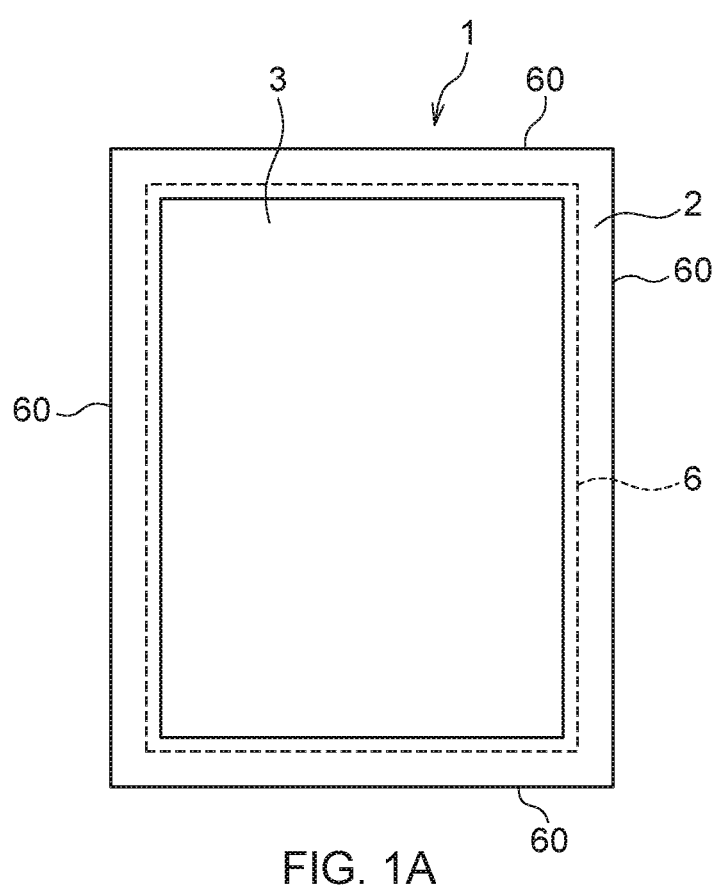
FIG. 1A is a plan view illustrating one example of a schematic configuration of a semiconductor device.
Figure 2:
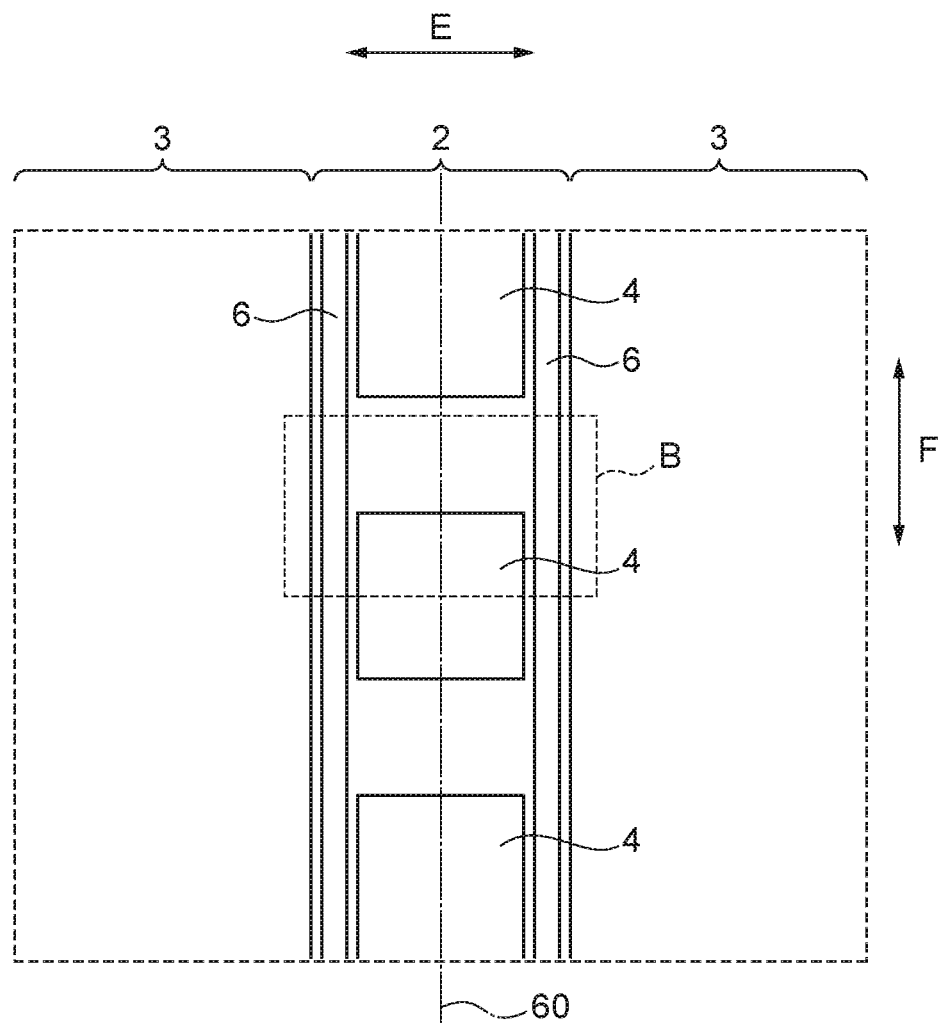
FIG. 2 is a plan view illustrating one example of a schematic configuration of a scribe region of the semiconductor device according to the first embodiment, and is an enlarged view of the region A in FIG. 1.

The scribe region 2 corresponds to a cutting region for separating the semiconductor wafer 100 into individual semiconductor devices 1 like the one illustrated in FIG. 1A. As illustrated in FIG. 2, the direction spanning the width of the scribe region 2 is referred to as the width direction E. The scribe region 2 is provided with a predetermined width defining the width direction E. The scribe region 2 extends in a direction orthogonal to the width direction E. In the scribe region 2, the direction at a right angle to the width direction F is referred to as the longitudinal direction F.

Figure 3:
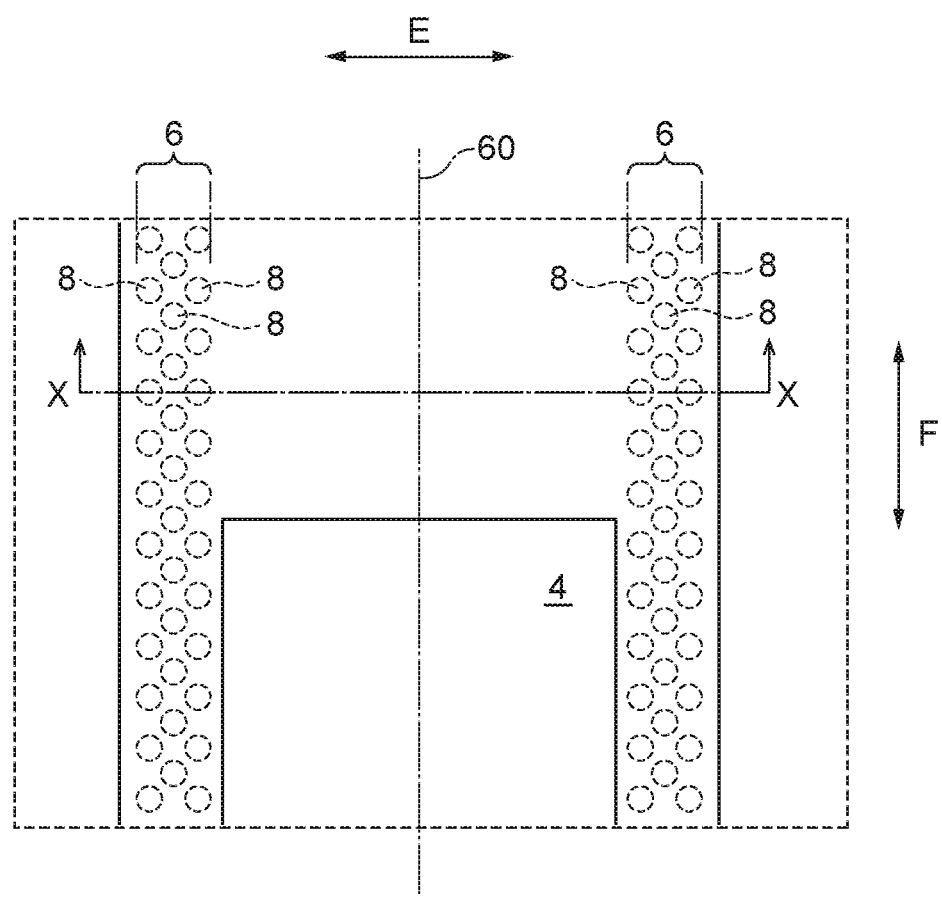
FIG. 3 is a plan view illustrating one example of a schematic configuration of a scribe region of the semiconductor device according to the first embodiment, and is an enlarged view of the region B in FIG. 2.
Figure 4:
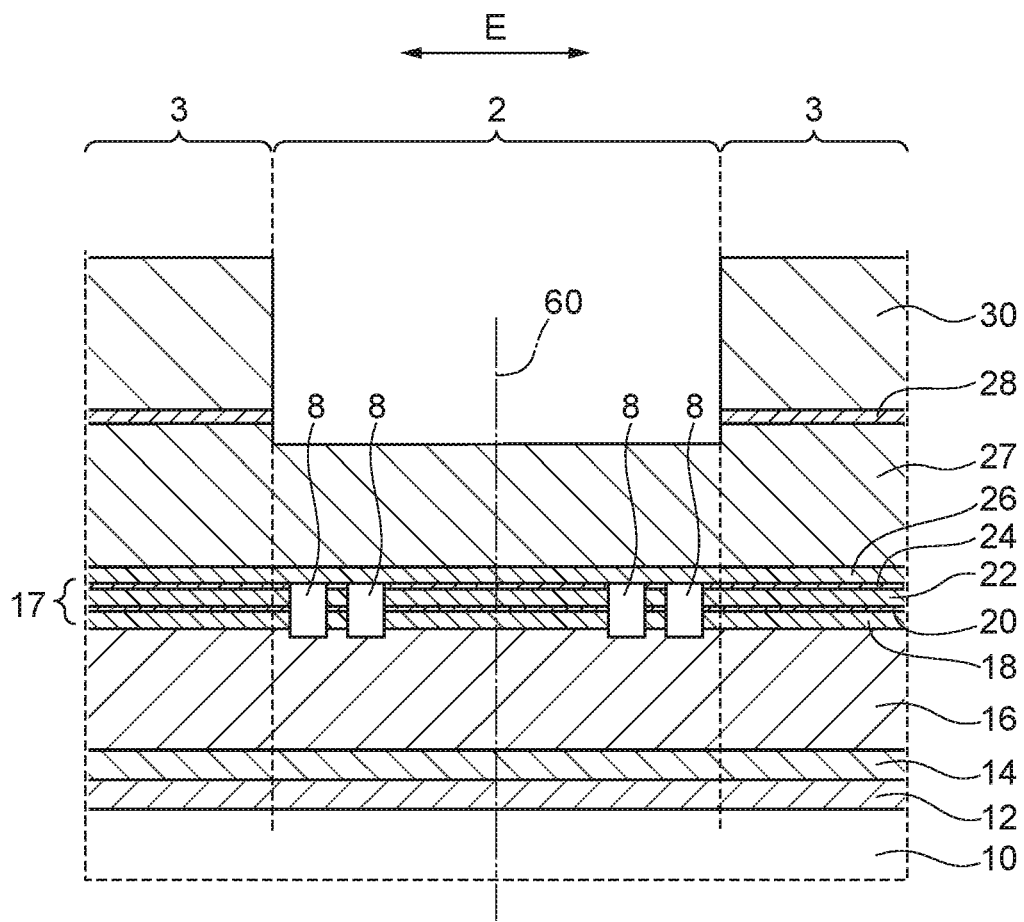
FIG. 4 is a longitudinal section illustrating one schematic example of the semiconductor device and a method of manufacturing the same according to the first embodiment, and is a diagram illustrating one example of a step following FIG. 11.

In FIGS. 2, 3, and 4, a cut portion 60 is illustrated in a central part of the scribe region 2. The cut portion 60 is formed in a later dicing step. The cut portion 60 is formed in the approximate center of the scribe region 2.

FIG. 2 is an enlarged view of the region A in FIG. 1, and is a plan view illustrating one example of a schematic configuration of the scribe region 2 exemplified in the first embodiment. FIG. 3 is an enlarged plan view of the region B in FIG. 2. FIG. 4 is a longitudinal section of the portion along the line X-X in FIG. 3.

As illustrated in FIG. 2, electrode pads 4 are provided in the scribe region 2. The scribe region 2 is provided with test element Croups (hereinafter referred to as TEGs) for measuring properties such as the electrical characteristics of the manufactured semiconductor devices 1. The electrode pads 4 are electrically connected to the TEDs. During a measurement of a TEG, the electrical characteristics of the TEG are measured by causing, a measuring, probe connected to a measuring instrument to abut the electrode pads 4. The electrode pads 4 contain a conductive material. For example, the electrode pads 4 contain a metal such as aluminum (Al). The electrode pads 4 may also contain a barrier metal provided above and below a metal electrode.

As illustrated in, FIG. 2, in the scribe region 2 provided between the main circuit regions 3, a penetrating portion placement region 6 is positioned near the ends in the width direction E of the scribe region 2, and is provided extending linearly in the longitudinal direction F of the scribe region 2. The penetrating portion placement region 6 is disposed on the outer sides in the width direction E of the electrode pads 4. The electrode pads 4 are interposed with the penetrating portion placement region 6 on either side in the width direction E. The position of the penetrating portion placement region 6 is decided in consideration of misalignment of the cut portion 60 in the dicing step, for example. The penetrating portion placement region 6 is disposed at the ends of the scribe region 2 at a position close to the main circuit regions 3, such that the cut portion 60 is not positioned closer toward the main circuit regions 3 than the penetrating portion placement region 6.

As illustrated in FIG. 3, a plurality of penetrating portions 8 are disposed in the penetrating portion placement region 6. The individual penetrating portions 8 are circular in plan view, and are columnar cavities in three dimensions as described later. As illustrated in FIG. 3, in the embodiment, the plurality of penetrating portions 8 are disposed in the penetrating portion placement region 6 to form three columns arranged in the width direction E, with each column disposed in a line in the longitudinal direction F. The plurality of penetrating portions 8 are arranged in a staggered manner.

The penetrating portion placement region 6 provided with the plurality of penetrating portions 8 disposed in this way is configured to isolate the cut portion 60 from the main circuit regions 3. Consequently, the propagation of cracks produced in the cut portion 60 during the dicing step is stopped by the penetrating portion placement region 6 where the plurality of penetrating portions 8 are disposed. With this arrangement, cracks produced in the cut portion 60 are kept from propagating to the main circuit regions 3.

The isolation effect provided by the penetrating portions 8 can be controlled by changing the size of the penetrating portions 8 and the arrangement density of the penetrating portions 8, for example. In the embodiment, three columns of penetrating portions 8 are arranged in a staggered manner, but two columns of the penetrating portions 8 arranged in alternation for example is also possible. In this case, it is desirable to increase the isolation effect that the penetrating portions 8 provide by increasing the density of the penetrating portions 8, such as by increasing the diameter of the penetrating portions 8 or reducing the pitch at which the penetrating portions 8 are arranged.

As illustrated in FIG. 4, in the scribe region 2 and the main circuit regions 3, an insulating film 12, an insulating film 14, a first insulating film 16, a low-k film 17, a second insulating film 26, an insulating film 27, and an insulating film 28 are stacked on a semiconductor substrate 10 in the above order proceeding upward from the semiconductor substrate 10. The low-k film 17 is provided between the first insulating film 16 and the second insulating film 26. Herein, a low-k film means a film having a lower dielectric constant (k) than a silicon oxide film used between Cu interconnects and a silicon nitride film that is deposited on the Cu interconnects to prevent Cu diffusion.

As illustrated in FIG. 4, in the penetrating portion placement region 6, the penetrating portions 8 are formed to make cavities having a rectangular cross-section that penetrates at least from the upper surface to the lower surface of the low-k film 17. The penetrating portions 8 are columnar cavities in three dimensions. The bottom of the penetrating portions 8 is positioned below the low-k film 17. The bottom of the penetrating portions 8 may also be formed with round curvature. The penetrating, portion placement region 6 is disposed closer to the main circuit regions 3 than the cut portion 60.

The low-k film 17 is disposed between the cut portion 60 and the main circuit regions 3. The ceilings of the penetrating portions 8 are formed by the second insulating film 26. The bottom of the penetrating portions 8 is formed by the first insulating film 16. Each penetrating portion 8 is an enclosed space surrounded by first insulating film 16, the second insulating film 26, and the low-k film 17.

In the first embodiment, the low-k film 17 includes a stacked film containing a first low-k film 18, a second low-k film 20, a third low-k film 22, and a fourth low-k film 24. The first low-k film 18 and the third low-k film 22 contain a carbon-doped silicon oxide film (SiOC film) for example. The second low-k film 20 and the fourth low-k film 24 are films capable of preventing the diffusion of Cu, and contain a nitrogen-doped silicon carbide film (SiCN film) for example. SiOC and SiCN are given as examples, and some other low-k material having a low dielectric constant can be used as the low-k film 17. Also, the low-k film 17 is not necessarily limited to the above configuration, and may also be a stacked film containing even more low-k films. The above film configuration is described as being similar in the second and third embodiments described later.

Figure 5A:
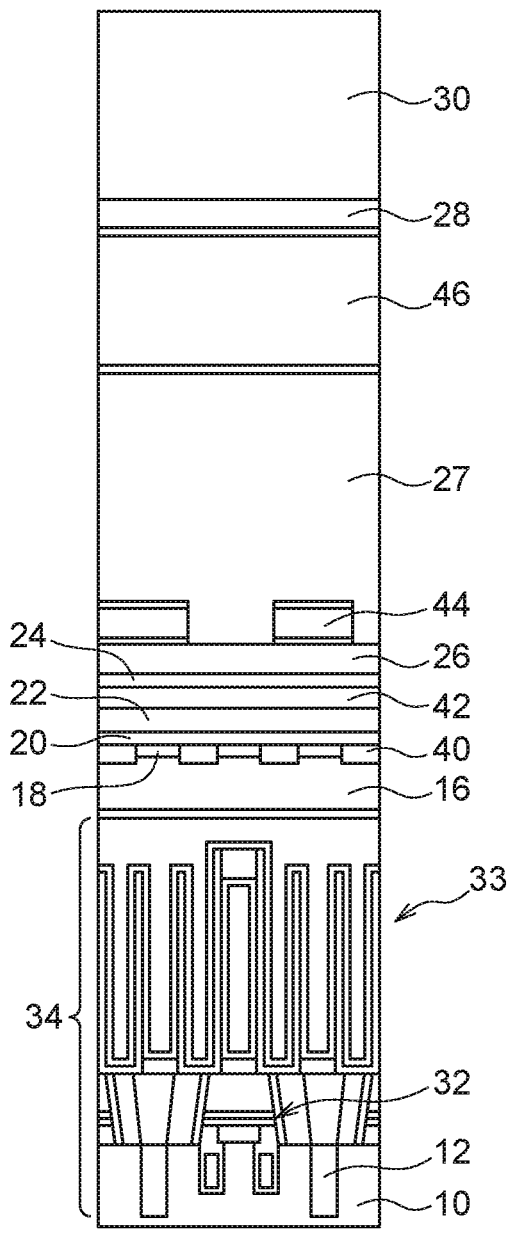
FIG. 5A is a longitudinal section illustrating one example of a schematic configuration of a memory cell region of the semiconductor device according to the first embodiment.
Figure 5B:
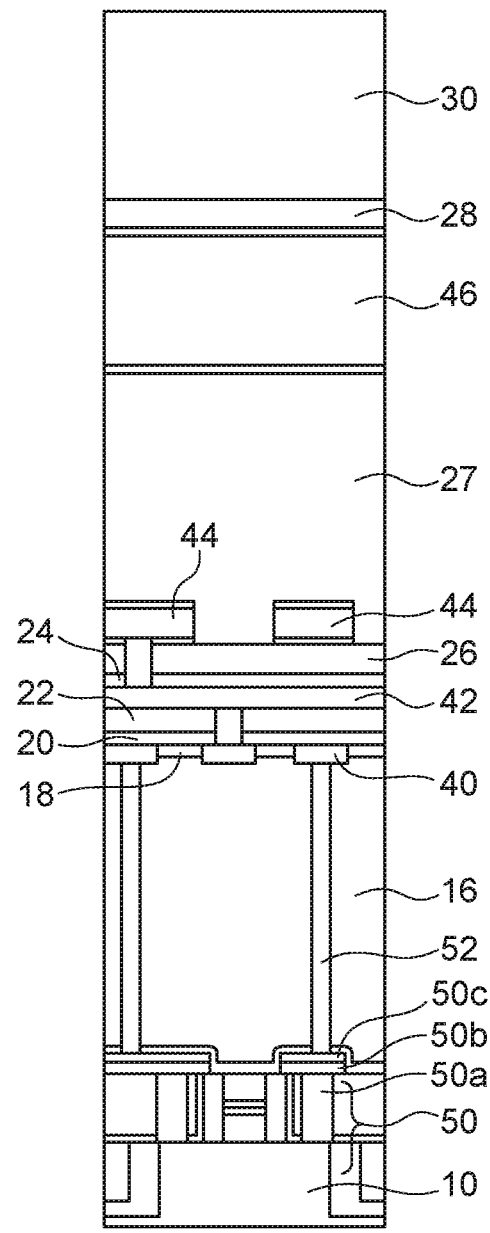
FIG. 5B is a longitudinal section illustrating one example of a schematic configuration of a peripheral circuit part of the semiconductor device according to the first embodiment.

FIG. 5A is a longitudinal section illustrating one example of a schematic configuration of a memory cell region of the DRAM in one of the main circuit regions 3. FIG. 5B is a longitudinal section illustrating one example of a schematic configuration of a peripheral circuit region of the DRAM in one of the main circuit regions 3. As illustrated in FIGS. 5A and 5B, the main circuit region 3 is provided with various elements and conductive interconnects forming the DRAM.

In FIG. 5A, components such as the insulating film 12, a memory element 34, the first insulating film 16, a first metal interconnect 40, a second metal interconnect 42, the low-k films 18, 20, 22, and 24, a third metal interconnect 44, the second insulating film 26, an insulating film 27, a rewiring metal layer 46, an insulating film 28, and a polyimide film 30 are provided on the semiconductor substrate 10. The low-k films 18, 20, 22, and 24 are provided between, alongside, below, and above the first metal interconnect 40 and the second metal interconnect 42. The memory element 34 includes components such as a select transistor 32 and a capacitor 33.

In FIG. 5B, components such as the insulating film 12, a peripheral circuit transistor 50, a contact 50a, a metal film 50b, a metal film 50c, a connecting electrode 52, the first insulating film 16, the first metal interconnect 40, the second metal interconnect 42, the low-k films 18, 20, 22, and 24, the third metal interconnect 44, the second insulating film 26, a rewiring metal layer 46, an insulating film 28, and the polyimide film 30 are provided on the semiconductor substrate 10. The low-k films 18, 20, 22, and 24 are provided between and alongside the first metal interconnect 40 and the second metal interconnect 42. The peripheral circuit transistor 50 is electrically connected to the first metal interconnect 40 through the contact 50a, the metal film 50b, the metal film 50c, and the connecting electrode 52.

Note that in the scribe region 2, the low-k films 18, 20, 22, and 24 are stacked to form the low-k film 17, as illustrated in FIG. 4 and the like. Note that in the scribe region 2, components such as a first metal interconnect 40, a second metal interconnect 42, a third metal interconnect 44, and a rewiring metal layer 46 that form the TEGs as well as contacts that join each of the interconnects also exist, but these components do not appear in the longitudinal section of the portion along the line X-X in FIG. 3. These components are not illustrated in the sectional views in FIG. 4 and FIGS. 6 to 21.

The first insulating film 16 is an interlayer insulating film disposed between the memory element 34 and the peripheral circuit transistor 50, and the first metal interconnect 40. The second insulating film 26 is an interlayer insulating film disposed between the third metal interconnect 44 and the rewiring metal layer 46.

Next, a method of manufacturing the semiconductor device 1 according to the first embodiment will be described with reference to FIGS. 6 to 11 and FIG. 4. FIGS. 6 to 11 and FIG. 4 are longitudinal sections of the portion along the line X-X in FIG. 3.

Figure 6:
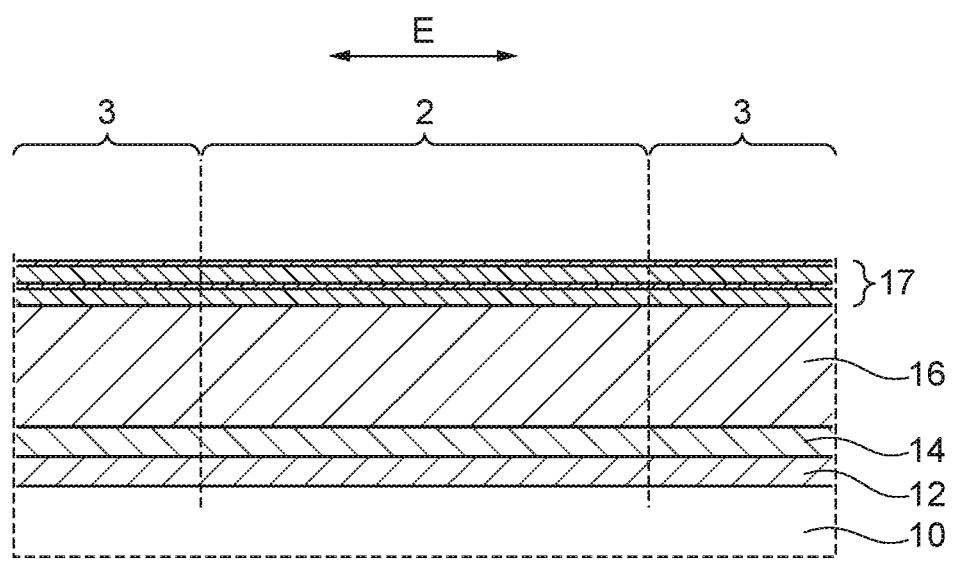
FIG. 6 is a longitudinal section illustrating one schematic example or a step partway, through a method of manufacturing the semiconductor device according to the first embodiment.

First, as illustrated in FIG. 6, the insulating film 12, the insulating film 14, the first insulating film 16, and the low-k film 17 are formed on the semiconductor substrate 10. The low-k film 17 includes a laminated film of the low-k films 18, 20, 22, and 24. Because the low-k film 17 is formed between the metal interconnects 40, 42, and 44 in the main circuit regions 3, in actuality, a step of forming the metal interconnects 40, 42, and 44 is also performed.

For the semiconductor substrate 10, a monocrystalline silicon substrate can be used, for example. The insulating film 12, the insulating film. 14, and the first insulating film 16 include silicon oxide films, for example. These silicon oxide films may also contain a substance such as phosphorus or boron. In FIG. 6, the low-k film 17 includes a laminated film of the low-k films 18, 20, 22, and 24. These films are formed by chemical vapor deposition, for example. The main circuit regions 3 in which components such as a DRAM memory 11 and peripheral circuit are formed are disposed on either side of the scribe region 2.

Figure 7:
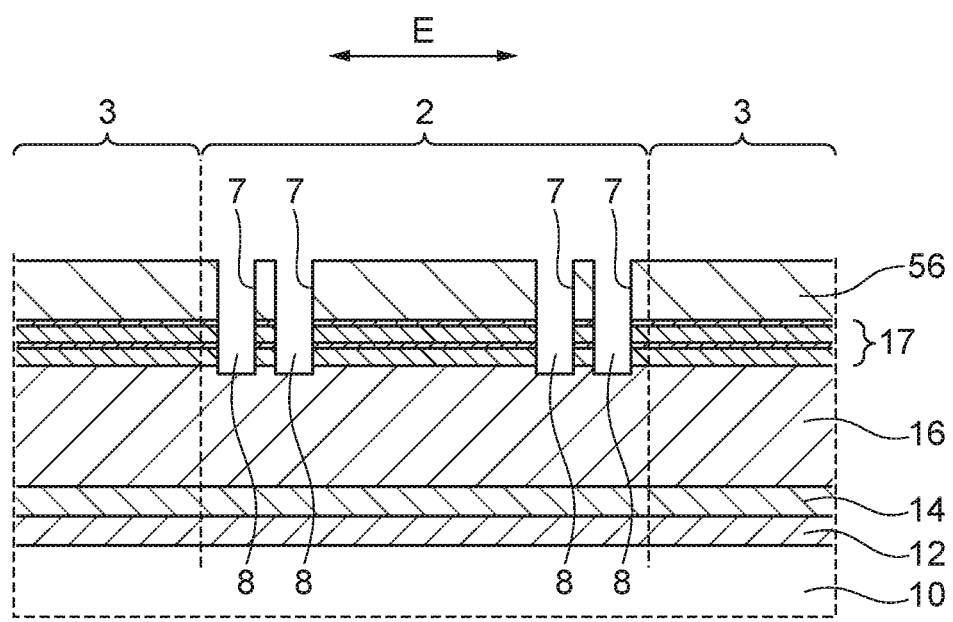
FIG. 7 is a longitudinal section illustrating one schematic example of a step partway through a method of manufacturing a semiconductor device according to the first embodiment, and is a diagram illustrating one example of a step following FIG. 6.

Next, as illustrated in FIG. 7, a photoresist 56 is formed such that opening patterns 7 are patterned. The opening patterns 7 formed in correspondence with the penetrating portions 8 disposed in the penetrating portion placement region 6. The opening patterns 7 are formed to be circular in plan view, like the penetrating portions 8. Next, anisotropic dry etching performed by using the photoresist 56 as a mask. With this arrangement, the low-k film 17 and a portion of the first insulating film 16 are successively etched away, and by transferring the shape of the opening patterns 7 to the low-k film 17 and a portion of the first insulating film 16, the penetrating portions 8 are formed. The penetrating portions 8 are formed to be circular in plan view.

The penetrating portions 8 penetrate through the low-k film 17 and reach partway through the first insulating film 16. The depth of the penetrating portions 8 can be controlled by setting an appropriate etching time, for example. The depth of the penetrating portions 8 can also be controlled by deciding when to stop etching by monitoring changes in the composition of the etching reaction gas, for example. According to this step, the penetrating portions 8 that reach from the upper surface to at least below the lower surface of the low-k film 17 are formed.

Figure 8:
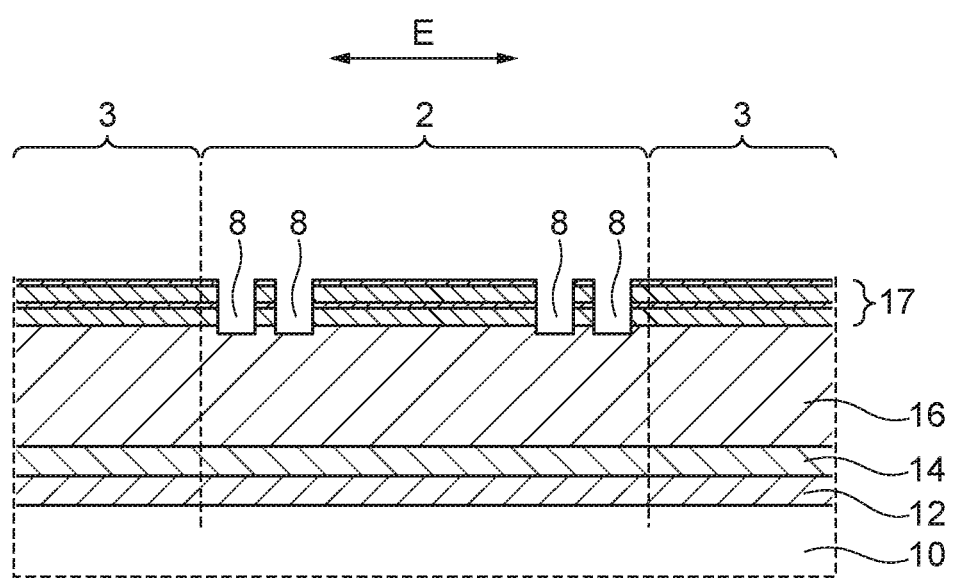
FIG. 8 is a longitudinal section illustrating one schematic example of a step partway through the method of manufacturing a semiconductor device according to the first embodiment, and is a diagram illustrating one example of a step following FIG. 7.

Next, as illustrated in FIG. 8, the photoresist 56 is removed. With this arrangement, the low-k film 17 in which the plurality of penetrating portions 8 are disposed is exposed on the uppermost surface. The penetrating portions 8 are cavities that are open on top.

Figure 9:
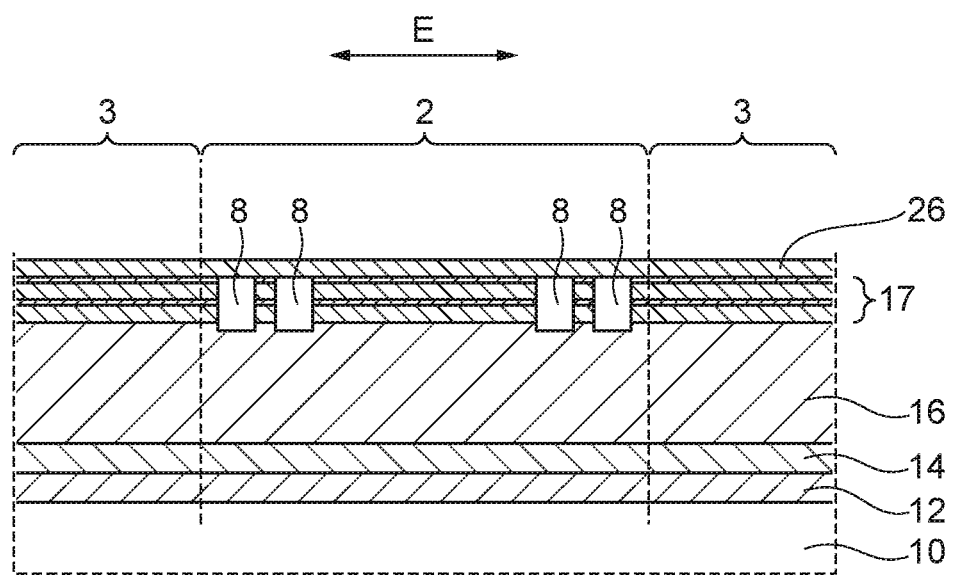
FIG. 9 is a longitudinal section illustrating one schematic example of a step partway through a method of manufacturing the semiconductor device according to a first embodiment, and is a diagram illustrating one example of a step following FIG. 8.

Next, as illustrated in FIG. 9, the second insulating film 26 is formed on the low-k film 17 in which the plurality of penetrating portions 8 are formed. The second insulating film 26 is a silicon oxide (SiO$_2$) film formed using plasma CVD, for example. Here, the second insulating film 26 is formed under low-coverage film-forming conditions. After temporarily forming a thick film under low-coverage film-forming conditions, the film thickness is decreased by etchback to form the second insulating film. 26 with a flat upper surface. The second insulating film 26 is formed such that the ceiling openings of the penetrating portions 8 are closed up, with little or no film being deposited inside the cavities of the penetrating portions 8. In this way, the ceiling openings of the penetrating portions 8 are covered by the second insulating film 26, and the cavities inside the penetrating portions 8 are retained. Note that in this case, the existence of a portion of the second insulating film 26 inside the penetrating portions 8 is tolerated.

Figure 10:
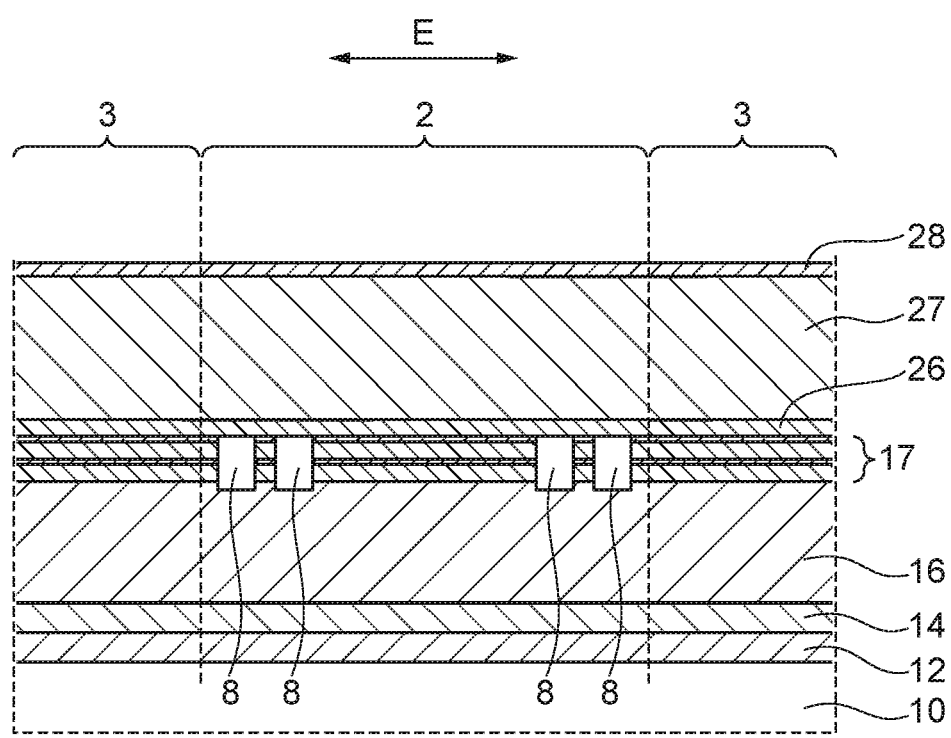
FIG. 10 is a longitudinal section illustrating one schematic example of a step partway through the method of manufacturing a semiconductor device a cording to the first embodiment, and a diagram illustrating one example of a step following FIG. 9.

Next, as illustrated in FIG. 10, an insulating film 27 is formed on the semiconductor substrate 10 on which the second insulating film 26 is formed. The insulating film 27 is a silicon oxide film formed by CVD, for example. The second insulating film 26 described above is formed by plasma CVD, and therefore includes a porous film, or in other words a rough film. For this reason, after decreasing the film thickness of the second insulating film 26 by etchback, the tight insulating film 27 is formed on the second insulating film 26.

Next, an insulating film 28 is formed on the insulating film 27. The insulating film 28 can be formed by CVD, for example. The insulating film 28 includes a silicon nitride (SiN) film, for example.

Figure 11:
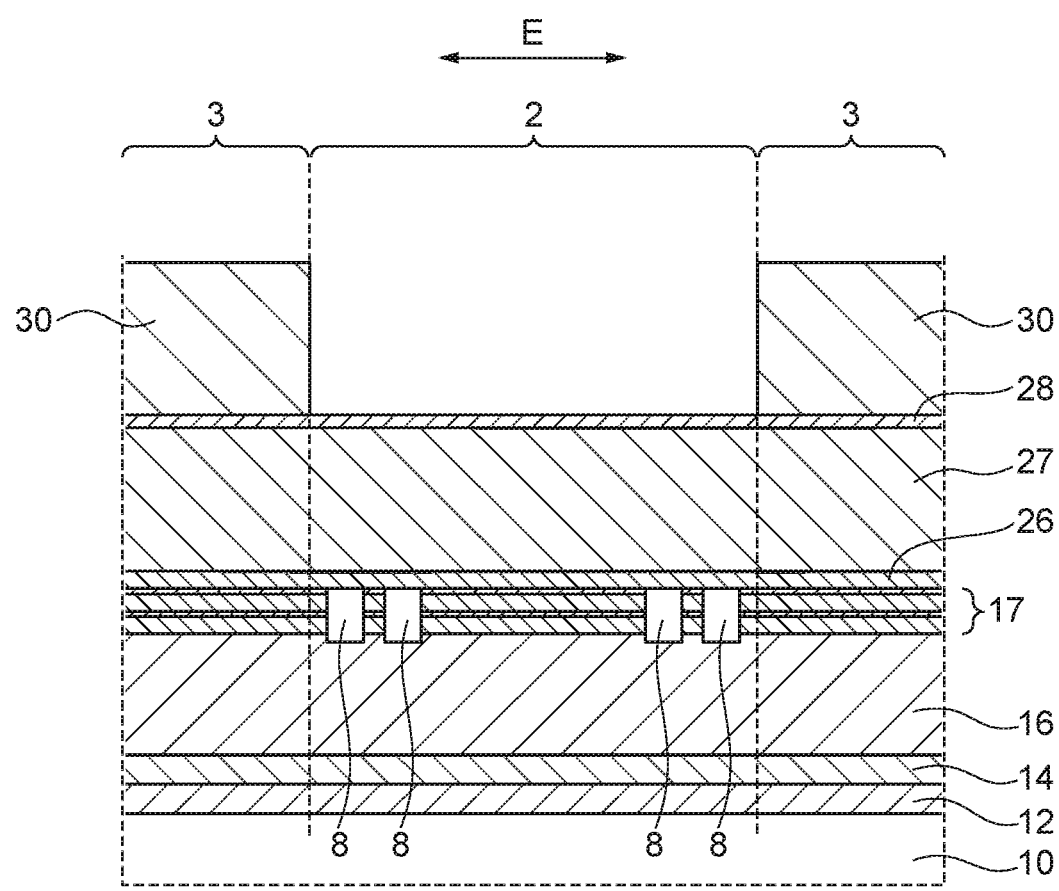
FIG. 11 is a longitudinal section illustrating one schematic example of a step partway through the method of manufacturing a semiconductor device according to the first embodiment, and is a diagram illustrating one example of a step following FIG. 10.

Next, as illustrated in FIG. 11, a polyimide film 30 patterned to leave open space above the scribe region 2 is formed. The polyimide film 30 used at this point contains a photopolymer material. The patterning of the polyimide film 30 is performed using known photolithography technology.

Next, as illustrated in FIG. 4, dry etching is performed using the polymide film 30 as a mask, thereby removing the insulating film 28 in the scribe region 2. At this time, in the main circuit region 3, a space for a bonding pad portion not illustrated is formed by removing the insulating film 28 in the bonding pad portion. The polyimide film 30 is provided as a passivation film for protecting the surface of the semiconductor device 1.

Next, in the scribe region 2, a dicing step is performed using blade dicing, stealth dicing, or some other dicing method, and the semiconductor substrate 10 is cut. According to the above, individually separated semiconductor devices 1 like the one illustrated in FIG. 1A can be manufactured. After that, although not illustrated in the diagrams, by assembling each semiconductor device 1 into a package, a semiconductor product ready for commercial distribution can be manufactured.

The semiconductor devices 1 are cut in the approximate center of the scribe region 2. The area that is cut becomes the cut portion 60. The cut portion 60 is the edge that defines the outline of the semiconductor device 1. In each semiconductor device 1, the scribe region 2 is provided around one of the main circuit regions 3. In the semiconductor device 1, the penetrating portion placement region 6 is disposed between the cut portion 60 and the main circuit region 3. The cut portions 60, or in other words the edges, are disposed around the perimeter of the scribe region 2.

According to the first embodiment described above, the following effects are exhibited.

In the semiconductor device 1, the penetrating portion placement region 6 is disposed between the cut portion 60 and the main circuit region 3. A plurality of penetrating portions 8 are disposed in the penetrating portion placement region 6. The penetrating portions 8 are provided with columnar cavities formed penetrating through the low-k film 17. The plurality of penetrating portions 8 are disposed in the penetrating portion placement region 6 to form three columns arranged in the width direction FE, with each column disposed in a line in the longitudinal direction F. The plurality of penetrating portions 8 are arranged in a staggered manner. The plurality of penetrating portions 8 are disposed such that the penetrating portions 8 exist in all directions facing the main circuit region 3 from the cut portion 60. The plurality of penetrating portions 8 are configured to isolate the cut portion 60 from the main circuit region 3.

Consequently, even if cracks produced in the cut portion 60 during the dicing step propagate iii the direction toward the main circuit region 3, the propagating cracks encounter the penetrating portions 8, and the propagation of the cracks is blocked the penetrating portions 8. With this arrangement, cracks produced in the cut portion 60 are kept from propagating to the main circuit regions 3. Because the cracks are stopped from reaching the main circuit region 3 by the penetrating portions 8 in one of the penetrating portion placement regions 6, the yield of the semiconductor device 1 is improved.

Second Embodiment

Next, a second embodiment will be described using FIGS. 1 to 3 and FIGS. 12 to 16. FIGS. 12 to 16 are longitudinal sections of the portion along the line X-X in FIG. 3. In the description of the second embodiment, elements shared in common with the first embodiment are denoted with similar signs or names, and a detailed description is omitted. First, a method of manufacturing a semiconductor device a cording to the second embodiment is described below. FIGS. 1 to 3 illustrate a plan layout of the second embodiment, and are similar to the first embodiment in this respect.

Figure 12:
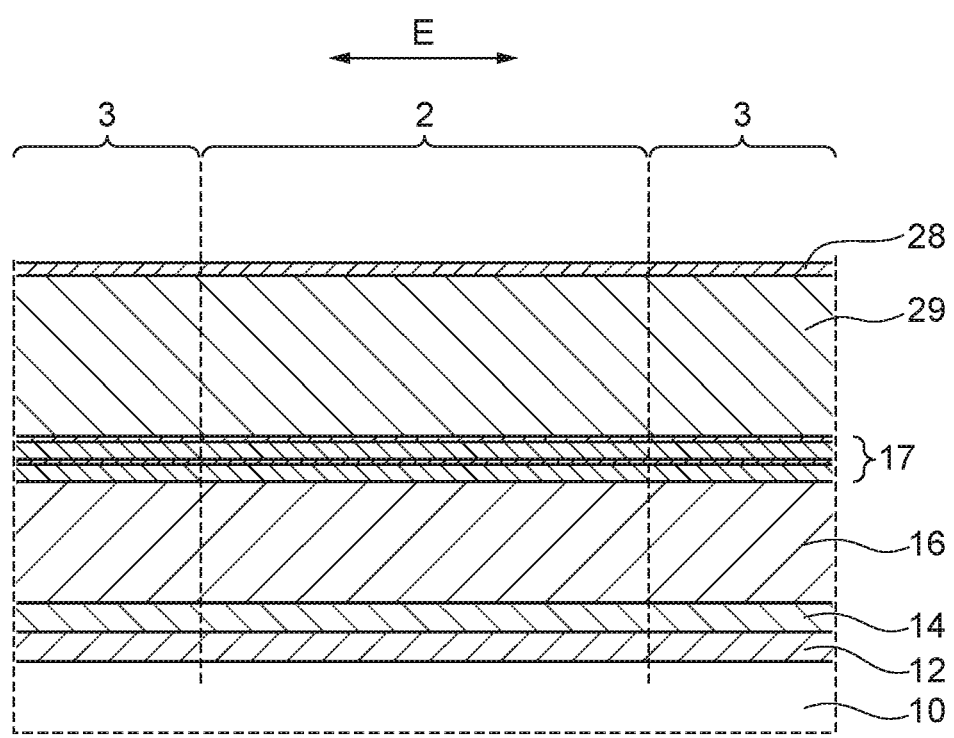
FIG. 12 is a longitudinal section illustrating one schematic example of a step partway through a method of manufacturing the semiconductor device according to a second embodiment.

Hereinafter, a method of manufacturing the semiconductor device 1 according to the second embodiment will be described with reference to FIGS. 12 to 16. First, as illustrated in FIG. 12, the insulating film 12, the insulating film 14, the first insulating film 16, the low-k film 17, an insulating film 29, and the insulating film 28 are formed on the semiconductor substrate 10. The low-k film 17 includes a laminated film of the low-k films 18, 20, 22, and 24. Note that, as illustrated in FIGS. 5A and 5B, because the low-k film 17 is formed between the metal interconnects 40, 42, 44, and the rewiring metal layer 46 in the main circuit region 3, in actuality, a step of forming the metal interconnects 40, 42, 44, the rewiring metal layer 46, and contacts joining these interconnect layers is also performed.

Figure 13:
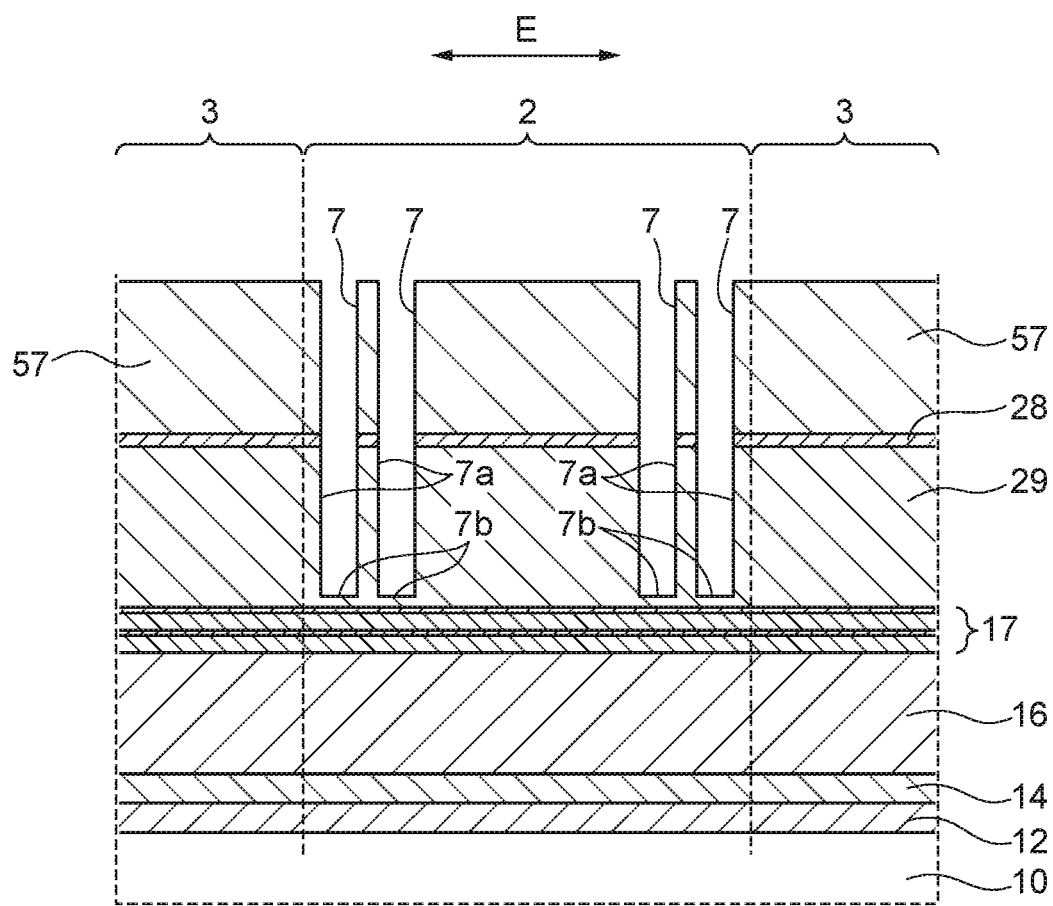
FIG. 13 is a longitudinal section illustrating one schematic example of a step partway through the method of manufacturing a semiconductor device according to the second embodiment, and is a diagram illustrating one example of a step following FIG. 12.

Next, as illustrated in FIG. 13, a photoresist 57 is formed such that opening patterns 7 leaving open space above the region where the plurality of penetrating portions 8 are to be formed in the penetrating portion placement region 6 are formed. The patterning of the photoresist 57 is performed using known lithography technology. Next, anisotropic dry etching is performed by using the photoresist 57 patterned as above as a mask. With this arrangement, in the opening patterns 7, etching proceeds through the insulating film 28 and partway through the insulating film 29.

Consequently, openings 7a obtained by the transfer of the opening, patterns 7 are formed in the insulating, film 28 and the insulating film 29. The bottom 7 of each opening 7a is positioned above the upper surface of the low-k film 17, and the depth of each opening 7a does not reach the upper surface of the low-k film 17. Also, the openings 7a are formed to have a shape and a size whereby the polyimide film 30 described later does not intrude into the openings 7a. For example, if the openings 7a are formed to be circular in plan view with a diameter of 6 or less, the polyimide film 30 may not intrude into the openings 7a.

Figure 14:
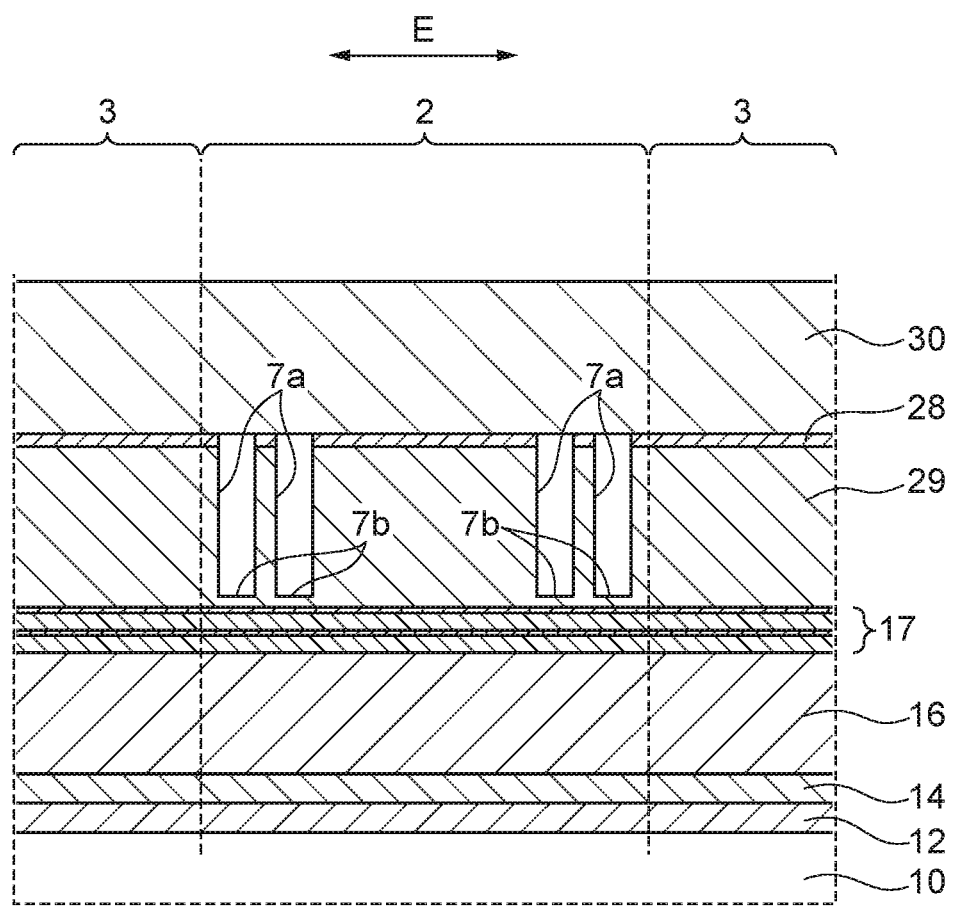
FIG. 14 is a longitudinal section illustrating one schematic example of a step partway through a method of manufacturing a semiconductor device according to the second embodiment, and is a diagram illustrating one example of a step following FIG. 13.

Next, as illustrated in FIG. 14, the photoresist 57 is removed using ashing technology for example, and subsequently, the polyimide film 30 is applied onto the insulating film 28. The polyimide film 30 used at this point contains a photopolymer material. The openings 7a are formed to have a size whereby the polyimide film 30 does not intrude. For this reason, the polyimide film 30 does not Intrude into the openings 7a.

Figure 15:
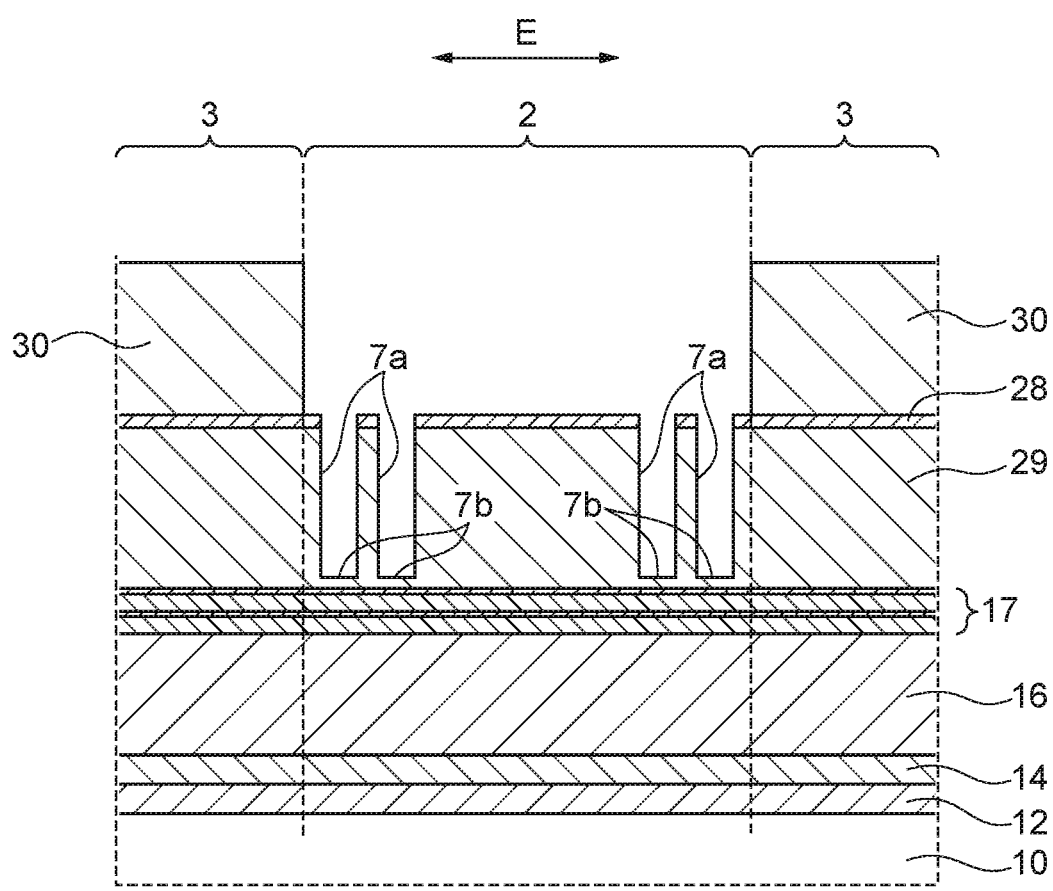
FIG. 15 is a longitudinal section illustrating one schematic example of a step partway through a method of manufacturing a semiconductor device according to the second embodiment, and is a diagram illustrating one example of a step following FIG. 14.
Figure 16:
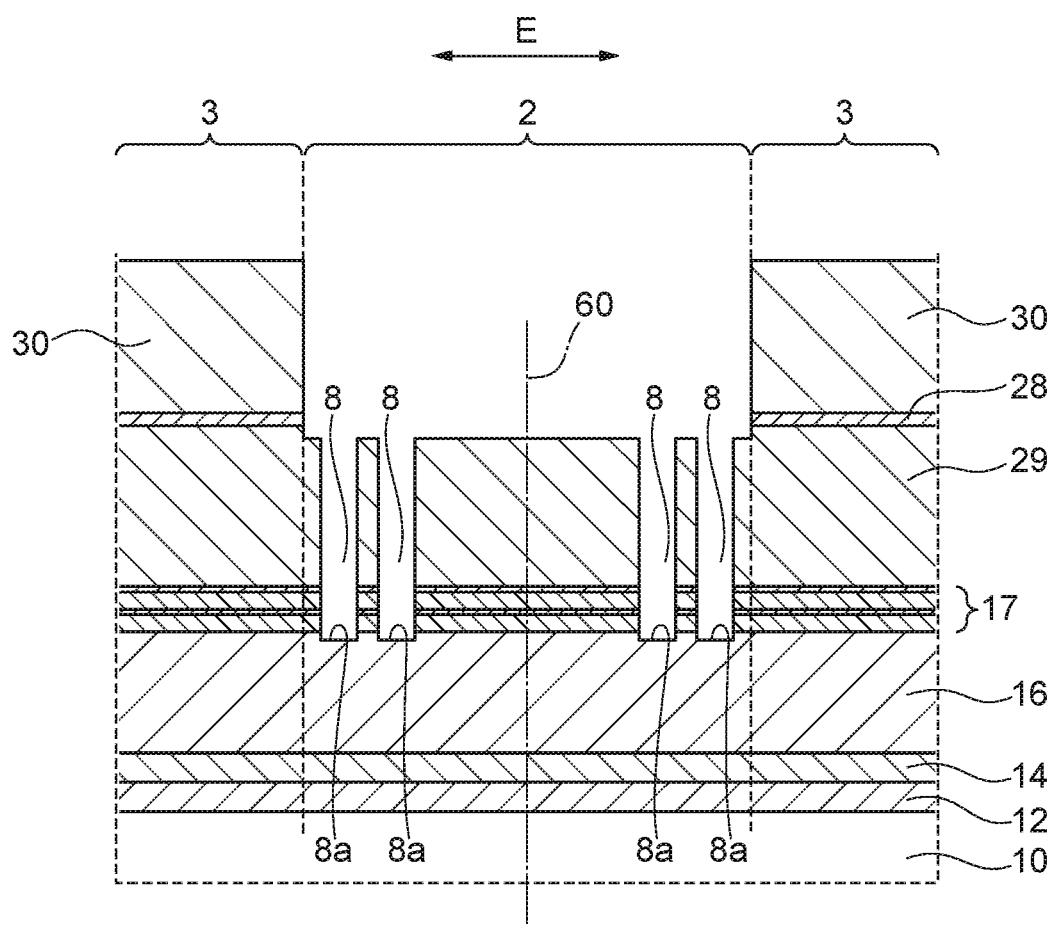
FIG. 16 is a longitudinal section illustrating one schematic example of the semiconductor device and a method of manufacturing the same according to the second embodiment, and is a diagram illustrating one example of a step following FIG. 15.

Next, as illustrated in FIG. 15, the polyimide film 30 is patterned using known photolithography technology. The polyimide film 30 is patterned to leave open space above the scribe region 2. Next, as illustrated in FIG. 16, anisotropic dry etching is performed on the insulating film 28 by using the patterned polyimide film 30 as a mask. At this time, the openings 7a are removed partway through the insulating film 29, but the low-k film 17 is also etched in the etching of the insulating film 28, and the insulating film. 29, the low-k film 17, and a portion of the first insulating film 16 below the openings 7a are etched. In this way, a plurality of penetrating portions 8 are formed.

On the other hand, in the scribe region 2 other than the penetrating portions 8, after the insulating film 28 is removed, the upper surface of the insulating film 29 is etched slightly. The upper surface of the insulating film 29 in the scribe region 2 is positioned downward from the formation position of the insulating film 28 by a predetermined distance.

Next, like the first embodiment, the semiconductor substrate 10 is cut in the scribe region 2 by performing a dicing step. According to the above, individually separated semiconductor devices 1 like the one illustrated in FIG. 1A can be manufactured. After that, although not illustrated in the diagrams, each semiconductor device 1 can be assembled in a package to manufacture a semiconductor product ready for commercial distribution.

According to the above steps, the plurality of penetrating portions 8 can be formed penetrating through the low-k film 17 and penetrating the low-k film 17 in the width direction E. Additionally, it is possible to form the semiconductor device 1 in which the intrusion of the polymide film 30 into the openings 7a is suppressed during the formation of the polyimide film 30. According to the second embodiment described above, effects similar to the first embodiment are obtained. Also, because the polyimide film 30 does not intrude into the openings 7a, compared to the case where the polyimide film 30 intrudes into the openings 7a, a long exposure for removing the polyimide film 30 is unnecessary. For this reason, the time taken by the manufacturing process of the semiconductor device 1 is shortened. With this arrangement, a cost-reduced semiconductor device 1 can be provided.

Third Embodiment

Next, a third embodiment will be described using FIGS. 6 to 8 and FIGS. 17 to 21. FIGS. 6 to 8 and FIGS. 17 to 21 are longitudinal sections of the portion along the line X-X in FIG. 3. In the description of the third embodiment, elements shared in common with the first and second embodiments are denoted with similar signs or names, and a detailed description is omitted.

Figure 17:
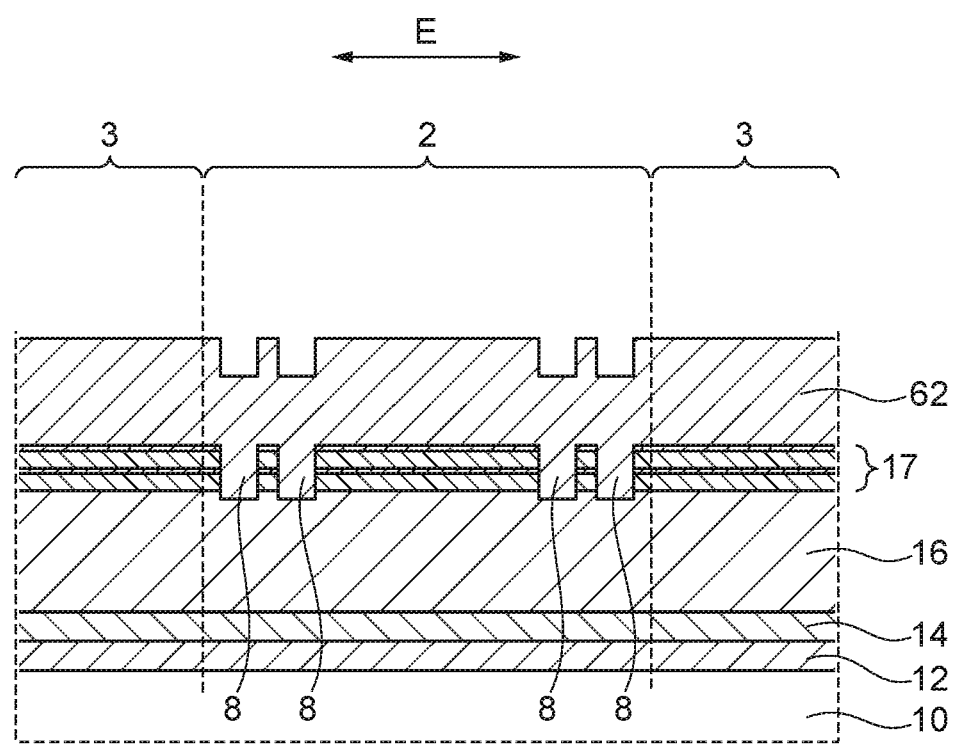
FIG. 17 is a longitudinal section illustrating one schematic example of a step partway through a method of manufacturing the semiconductor device according to the third embodiment.

Hereinafter, a method of manufacturing a semiconductor device according to the third embodiment will be described. In the method of manufacturing a semiconductor device according to the third embodiment, the steps performed in FIGS. 6 to 8 of the first embodiment are performed. Next, as illustrated in FIG. 17, a third insulating film 62 is formed on the low-k film 17. The third insulating film 62 is a silicon oxide film, for example. The third insulating film 62 is formed using CVD under high-coverage deposition conditions, for example. With this arrangement, the penetrating portions 8 are buried with the third insulating film 62. The third insulating film 62 is formed thickly in consideration of the amount by which the thickness of the film is reduced in a CMP process described later. On the upper surface of the third insulating film 62, raised and lowered portions reflecting the shapes of the per portions 8 formed in the low-k film 17 are formed.

Figure 18:
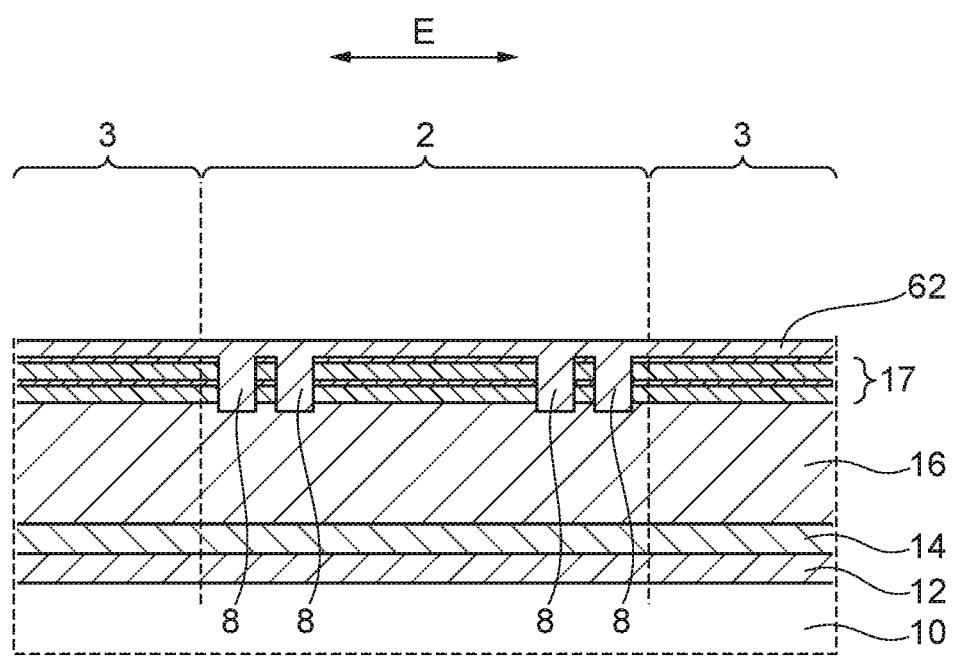
FIG. 18 is a longitudinal section illustrating one schematic example of a step partway through a method of manufacturing a semiconductor device according to the third embodiment, and is a diagram illustrating one example of a step following FIG. 17.

Next, as illustrated in FIG. 18, chemical mechanical polishing, (hereinafter referred to as amP) is performed on the third insulating film 62 to leave the third insulating film 62 of predetermined thickness on the low-k film 17. The raised and Towered portions are removed from the upper surface of the third insulating film 62, resulting in a flat surface.

Figure 19:
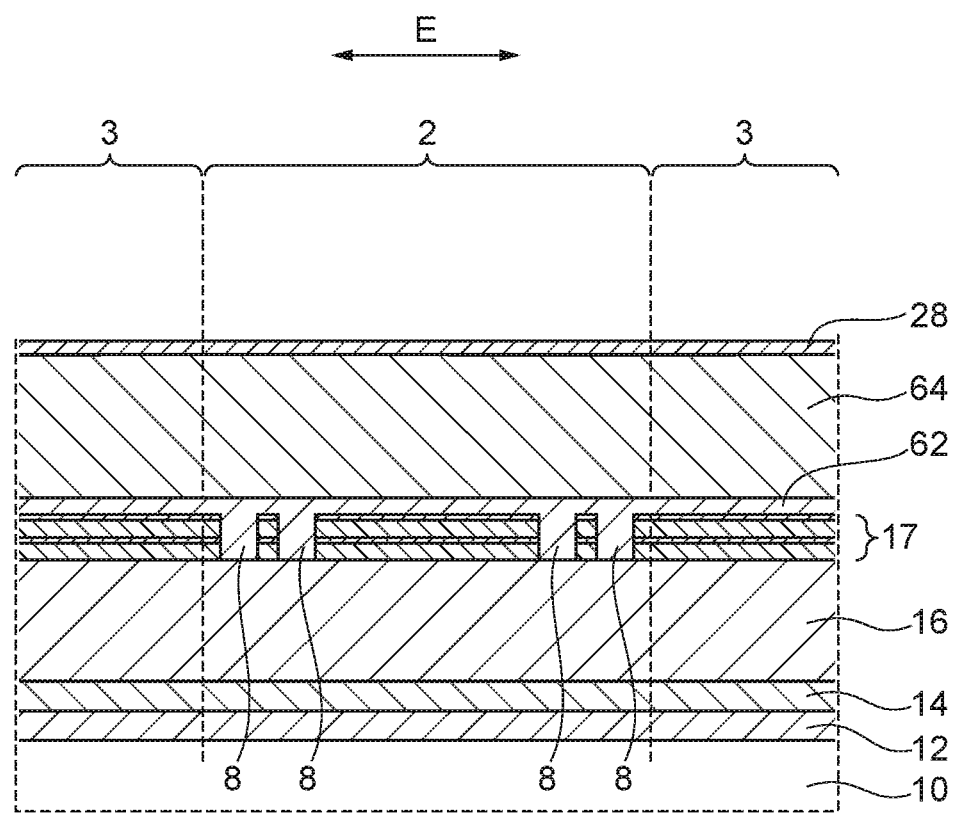
FIG. 19 is a longitudinal section illustrating one schematic example of a step partway through a method of manufacturing a semiconductor device according to the third embodiment, and is a diagram illustrating one example of a step following FIG. 18.

Next, as illustrated in FIG. 19, an insulating film 64 and the insulating film 28 are formed on the third insulating film 62 of FIG. 18. The insulating film 64 is a silicon oxide film, for example. The insulating film 64 is formed by CVD, for example. The insulating film 28 includes a silicon nitride film, for example. The insulating film 28 is formed by CVD, for example.

Figure 20:
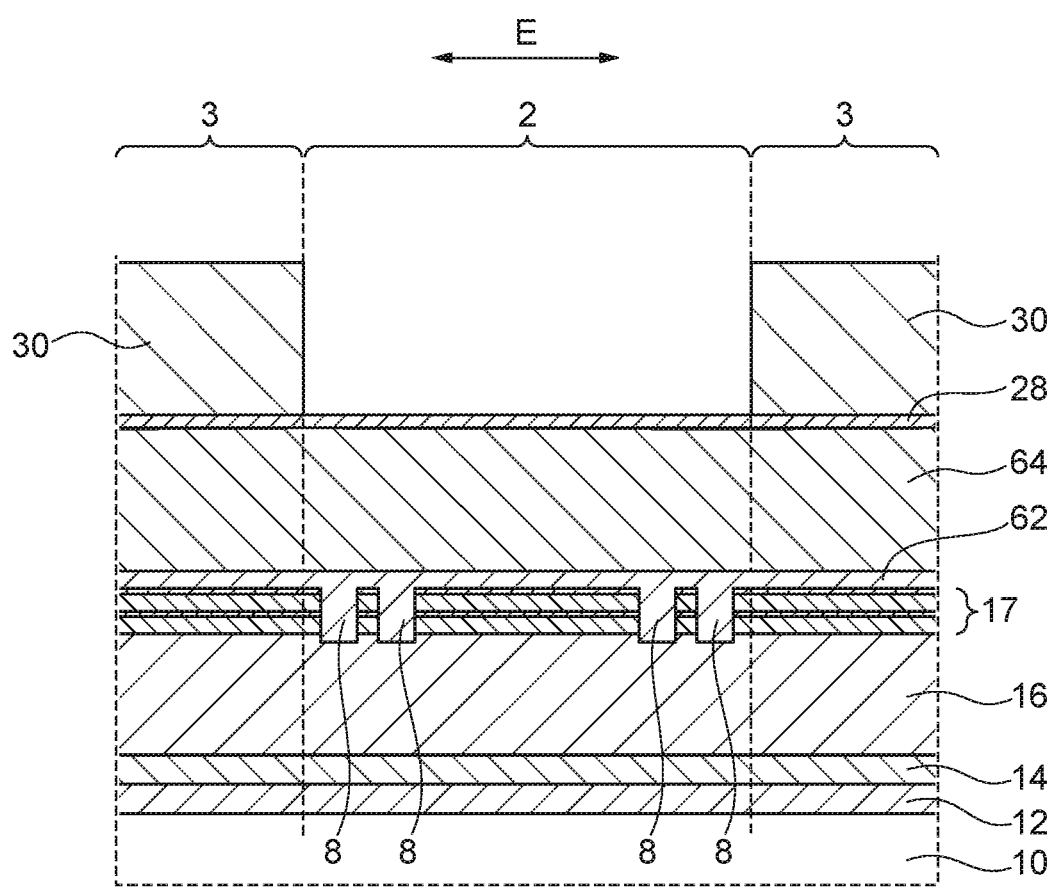
FIG. 20 is a longitudinal section illustrating one schematic example or a step partway, through a method of manufacturing a semiconductor device according to the third embodiment, and is a diagram illustrating one example of a step following FIG. 19.

Next, as illustrated in FIG. 20, the polyimide film 30 patterned to leave open space above the scribe region 2 is formed. The polyimide film 30 used at this point contains a photopolymer material. The patterning of the polyimide film 30 is performed using known photolithography technology.

Figure 21:
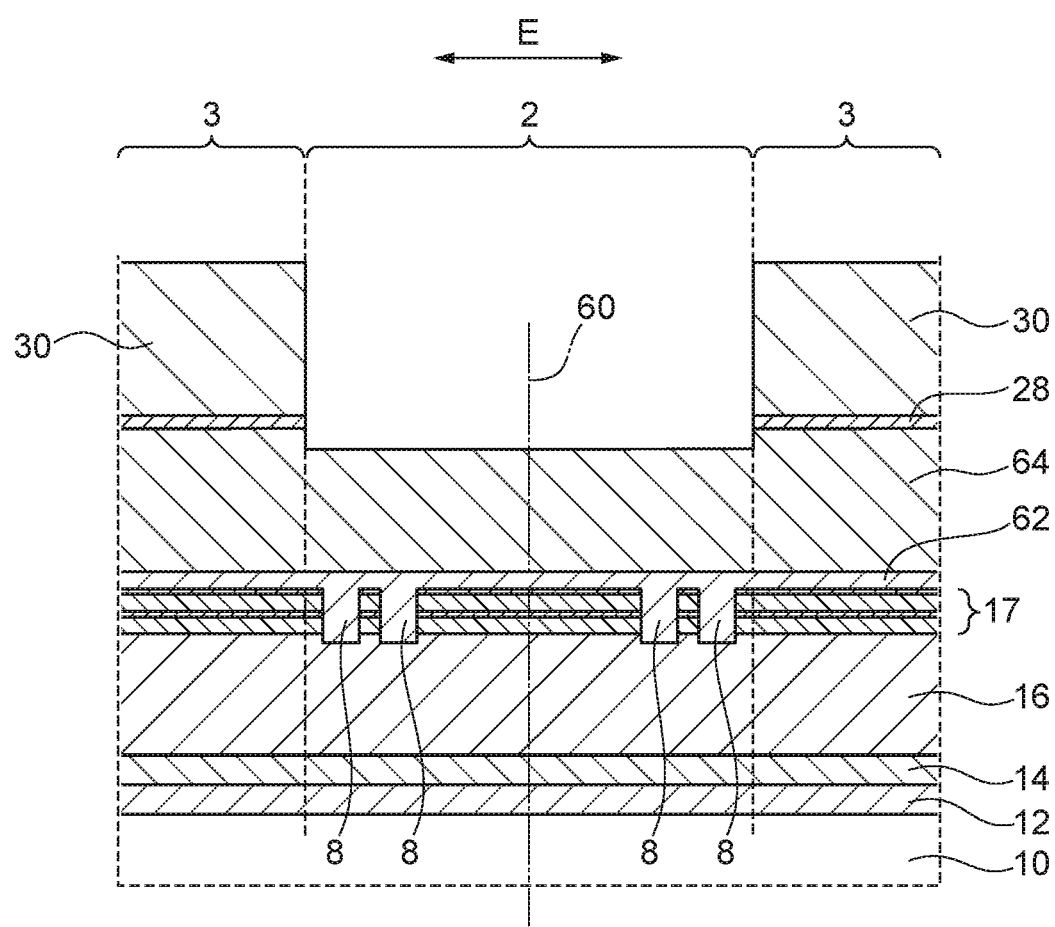
FIG. 21 is a longitudinal section illustrating one schematic example of the semiconductor device and a method of manufacturing the same according to the third embodiment, and is a diagram illustrating one example of a step following FIG. 20.

Next, as illustrated in FIG. 21, anisotropic dry etching is performed by using the polyimide film 30 as a mask. Through the etching, the insulating film 28 in the scribe region 2 is removed.

According to the third embodiment described above, effects similar to the first and second embodiments are obtained. Also, according to the third embodiment, the penetrating portions 8 are buried with the third insulating film 62, and the third insulating film 62 and the first insulating film 16 are connected in the lower part of the penetrating portions 8. According to this configuration, because the third insulating film 62 penetrates through the low-k film 17 in the penetrating portions 8 and is also hurried in the penetrating portions 8, and because the third insulating film 62 and the first insulating film 16 are connected, the mechanical strength in this portion is improved.

Consequently, the effect of suppressing the propagation of cracks in this portion is improved further.

Fourth Embodiment

Figure 22:
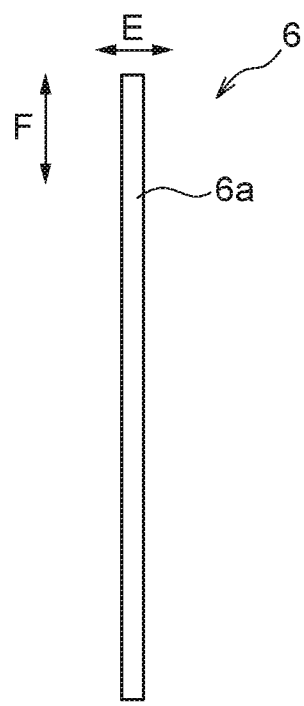
FIG. 22 is a plan view illustrating one example of a schematic configuration of a groove formed in the scribe region.
Figure 23:
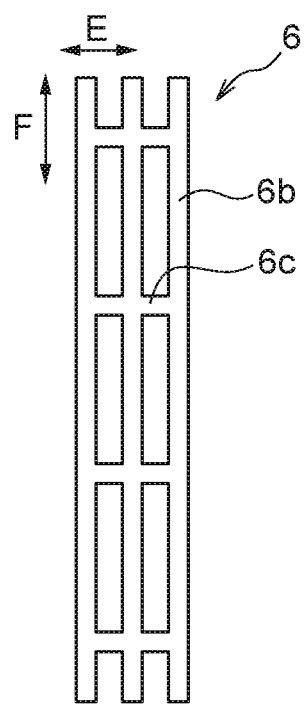
FIG. 23 is a plan view illustrating one example of a schematic configuration of a groove formed in the scribe region.
Figure 24:
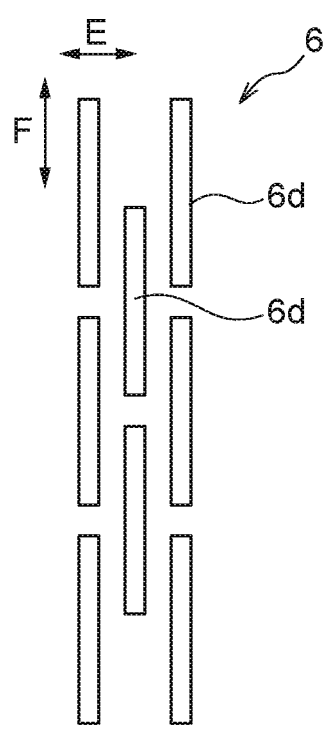
FIG. 24 is a plan view illustrating one example of a schematic configuration of a groove formed in the scribe region.

Next, a fourth embodiment will be described using FIGS. 22, 23, and 24. In the semiconductor device 1 according to the fourth embodiment, three exemplary configurations of the penetrating portion placement region 6 are disclosed. As a first exemplary configuration, the penetrating portion placement region 6 includes a groove 6a extending in the longitudinal direction, as illustrated in FIG. 22. As a second exemplary configuration, the penetrating portion placement region 6 includes grooves 6b extending in the longitudinal direction and grooves 6c extending in the width direction F, as illustrated in FIG. 23. The grooves 6b and 6c combine to form a ladder shape. As a third exemplary configuration, the penetrating portion placement region 6 includes grooves 6d configured to have a predetermined length in the longitudinal direction F, as illustrated in FIG. 24. The grooves 6d combine to form a staggered arrangement. Each of the grooves 6a, 6b, 6c, and 6d illustrated in the above three examples penetrates through the low-k film 17 and divides the low-k film 17 in the width direction E.

In the first to third embodiments, the penetrating portion placement region 6 contains the plurality of penetrating portions 8 arranged in a staggered manner. In contrast, in the fourth embodiment, the penetrating portion placement region 6 contains a combination of the plurality of grooves 6a, 6b, 6c, and 6d of narrow width. By adopting such a configuration, the plurality of grooves 6a, 6b, 6c, and 6d divide the low-k film 17 in the region from the cut portion 60 to the main circuit regions 3. According to this configuration, it is possible to increase the chance of deterring cracks produced in the cut portion 60 from propagating to the main circuit regions 3. Consequently, the propagation of cracks produced in the cut portion 60 to the main circuit regions 3 can be suppressed further.

As above, DRAM is described as an example of the semiconductor device 1 according to various embodiments, but the above description is merely one example and not intended to be limited to DRAM. Memory devices other than DRAM, such as static random-access memory (SRAM), Lash memory, erasable programmable reap-only memory (EPROM), magnetoresistive random-access memory (MRAD), and phase-change memory for example can also be applied as the semiconductor device 1. Furthermore, devices other than memory, including logic ICs such as a microprocessor and an application-specific integrated circuit (ASIC) for example are also applicable as the semiconductor device 1 according to the foregoing embodiments.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A semiconductor device comprising:
a main circuit region; and
a scribe region surrounding the main circuit region;
wherein the main circuit region and the scribe region comprise first and second insulating films and a low-k film formed therebetween; and
wherein the scribe region includes a plurality of cavities that penetrate through the low-k film and reach partway through the first insulating film, and line along a border between the main circuit region and the scribe region.

2. The semiconductor device of claim 1, wherein the scribe region has a predetermined width defining a width direction and a longitudinal direction orthogonal to the width direction, and the region where a plurality of the cavities are lining is located at an end of the scribe region in the width direction and extends in the longitudinal direction.

3. The semiconductor device of claim 1, wherein the plurality of the cavities are circular in plan view, and are arranged in a staggered manner.

4. The semiconductor device of claim 1, wherein each of the cavities is buried with an insulating film.

5. The semiconductor device of claim 1, wherein the low-k film comprises a stacked film of a plurality of low-k films.

6. The semiconductor device of claim 1, wherein a plurality of interconnects are included in the main circuit region, and the low-k film is formed between the plurality of interconnects.

7. The semiconductor device of claim 1, wherein the low-k film comprises a stacked film of SiOC and SiCN, and wherein the first insulating film and the second insulating film comprise silicon oxide films.

* * * * *